(12) United States Patent
Ueda et al.

(10) Patent No.: US 10,077,495 B2
(45) Date of Patent: Sep. 18, 2018

(54) METHOD FOR MANUFACTURING CATALYST FOR CARBON NANOTUBE SYNTHESIS

(71) Applicant: Hitachi Chemical Company, Ltd., Tokyo (JP)

(72) Inventors: Shunsuke Ueda, Ibaraki (JP); Eisuke Haba, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 239 days.

(21) Appl. No.: 14/424,229

(22) PCT Filed: Aug. 21, 2013

(86) PCT No.: PCT/JP2013/072306
§ 371 (c)(1),
(2) Date: Feb. 26, 2015

(87) PCT Pub. No.: WO2014/034496
PCT Pub. Date: Mar. 6, 2014

(65) Prior Publication Data
US 2015/0217287 A1 Aug. 6, 2015

(30) Foreign Application Priority Data

Aug. 29, 2012 (JP) ................................. 2012-189304

(51) Int. Cl.
*C23C 14/34* (2006.01)
*C23C 14/22* (2006.01)
(Continued)

(52) U.S. Cl.
CPC ........... *C23C 14/223* (2013.01); *B01J 23/745* (2013.01); *B01J 37/0223* (2013.01);
(Continued)

(58) Field of Classification Search
CPC ... C23C 14/0036; C23C 14/14; C23C 14/223; C23C 14/34; C01B 31/0226;
(Continued)

(56) References Cited

U.S. PATENT DOCUMENTS 4,940,523 A  7/1990  Takeshima
6,038,999 A  3/2000  Cattenot
(Continued)

FOREIGN PATENT DOCUMENTS

CN  102482098 A  5/2012
EP  2476648 A1  7/2012
(Continued)

OTHER PUBLICATIONS

Surface modification of carbon nanofibers with platinum nanoparticles using a "polygonal barrel-sputtering" system. Yamamoto, H.; Hirakawa, K.; Abe, T. Hydrogen Isotope Research Center, Toyama, Japan. p. 2118-2121. Published online 2007.*

(Continued)

*Primary Examiner* — Michael A Band
(74) *Attorney, Agent, or Firm* — Fitch, Even, Tabin & Flannery LLP

(57) ABSTRACT

Single walled carbon nanotubes can be synthesized and production efficiency of carbon nanotubes can be enhanced by a method including a supplying step (S11) in which particulate carriers are supplied into a drum, a sputtering step (S12) for supporting a catalyst, in which sputtering is performed while this drum 10 is rotated around the axis and is swung so that one end portion and the other end portion in the axial direction of the drum 10 are relatively vertically switched, and a recovering step (S13) in which the particulate carriers are recovered by inclining the drum to discharge the particulate carriers from the drum.

4 Claims, 14 Drawing Sheets

(51) Int. Cl.
*C23C 14/14* (2006.01)
*C23C 14/00* (2006.01)
*C01B 32/162* (2017.01)
*C01B 32/16* (2017.01)
*B82Y 40/00* (2011.01)
*B82Y 30/00* (2011.01)
*B01J 37/34* (2006.01)
*B01J 37/02* (2006.01)
*B01J 23/745* (2006.01)

(52) U.S. Cl.
CPC ............ *B01J 37/347* (2013.01); *B82Y 30/00* (2013.01); *B82Y 40/00* (2013.01); *C01B 32/16* (2017.08); *C01B 32/162* (2017.08); *C23C 14/0036* (2013.01); *C23C 14/14* (2013.01); *C23C 14/34* (2013.01)

(58) Field of Classification Search
CPC . C01B 31/0233; B01J 37/0233; B01J 23/745; B01J 37/347; B01J 35/026; B01J 37/34; B82Y 40/00; B82Y 30/00
See application file for complete search history.

(56) References Cited

U.S. PATENT DOCUMENTS

| | | | |
|---|---|---|---|
| 6,241,858 B1 | 6/2001 | Phillips et al. | |
| 2005/0112052 A1 | 5/2005 | Gu et al. | |
| 2012/0035388 A1* | 2/2012 | Li | B01J 21/185 560/60 |

FOREIGN PATENT DOCUMENTS

| | | |
|---|---|---|
| GB | 1497782 A | 1/1978 |
| JP | H2-153068 A | 6/1990 |
| JP | 03153864 A | 7/1991 |
| JP | H03-219067 | 9/1991 |
| JP | 2003286015 A | 10/2003 |
| JP | 2007204786 A * | 8/2007 |
| JP | 2008-045197 A | 2/2008 |
| JP | 2009078232 | 4/2009 |
| JP | 2009079251 A | 4/2009 |
| JP | 2011-149104 | 8/2011 |
| WO | 2008018619 A1 | 2/2008 |
| WO | 2009110591 A1 | 9/2009 |
| WO | 2011030821 A1 | 3/2011 |

OTHER PUBLICATIONS

Machine Translation JP2007204786A.*
Schmid G et al, "Optimization of a container design for depositing uniform metal coatings on glass microspheres by magnetron sputtering", Surface and Coatings Technology, vol. 205, No. 7, Dec. 25, 2010, pp. 1929-1936, XP027533891 in English.
Search Report in counterpart EP Patent Application No. 13833753.0 dated Apr. 5, 2016 in English.
International Search Report for International Patent Application No. PCT/JP2013/072306 dated Oct. 15, 2013.
Dong Young Kim, Hisashi Sugime, Kei Hasegawa, Toshio Ogawa, Suguru Noda, "Fluidized-bed synthesis of submillimeter-long single walled carbon nanotube array", Carbon 50, 2012, p1538-p1545.
International Preliminary Report on Patentability for International Application No. PCT/JP2013/072306, dated Mar. 12, 2015.
Office Action in counterpart JP Patent Application No. P2012-189304 dated Jan. 10, 2017.
Office Action of JP Patent Application No. P2012-189304 dated Aug. 15, 2017.

* cited by examiner

Fig.5
(a)
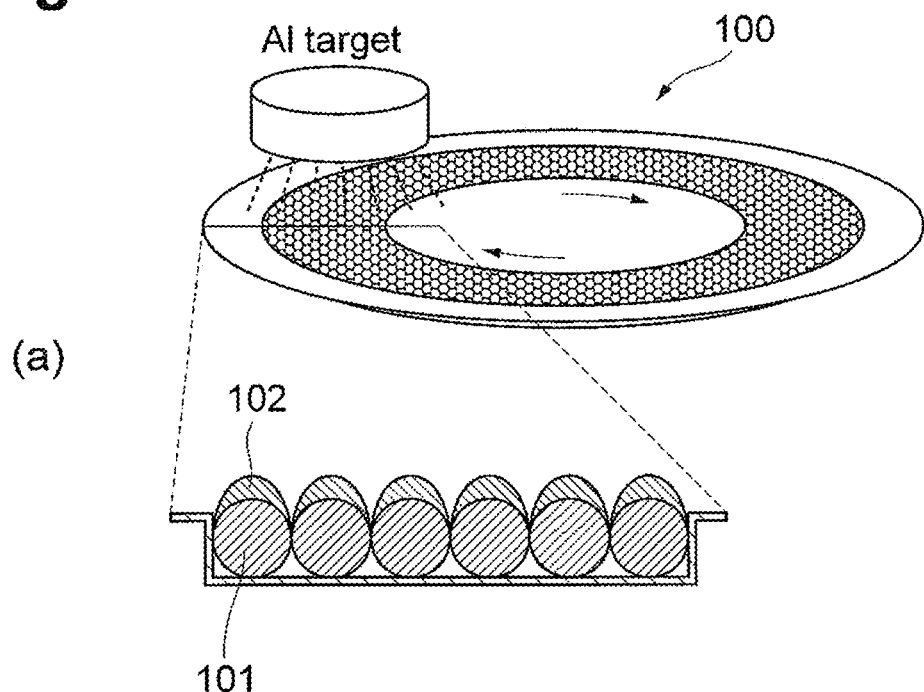
(b)
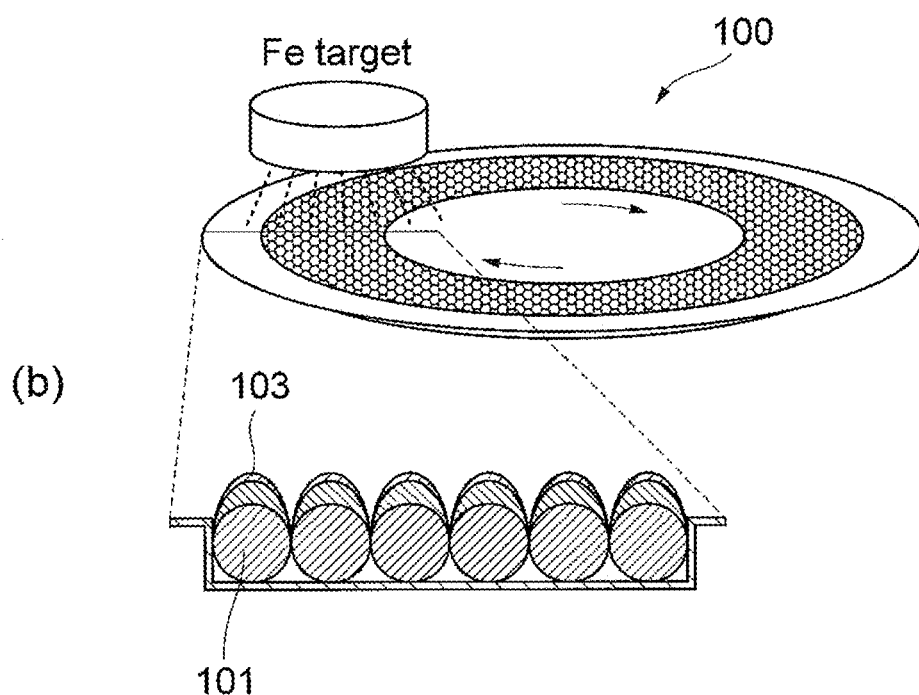

Fig.7
(a) 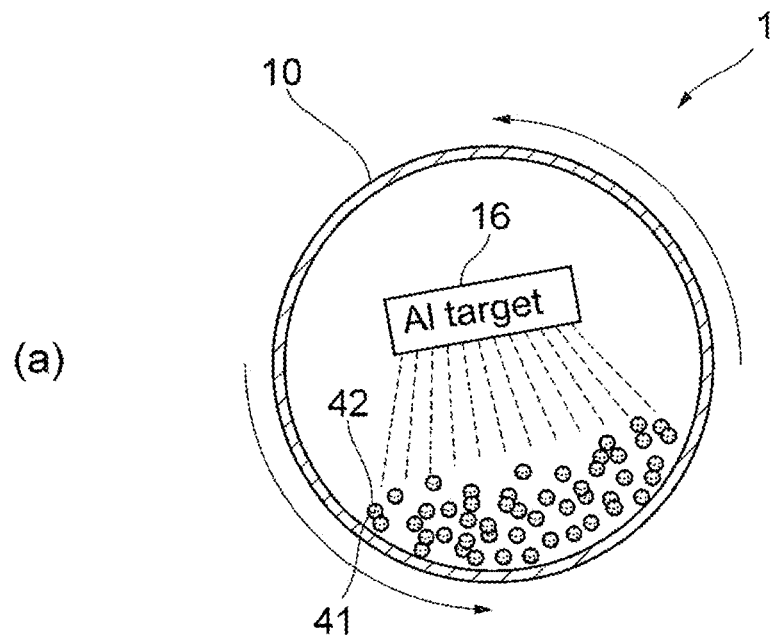
(b) 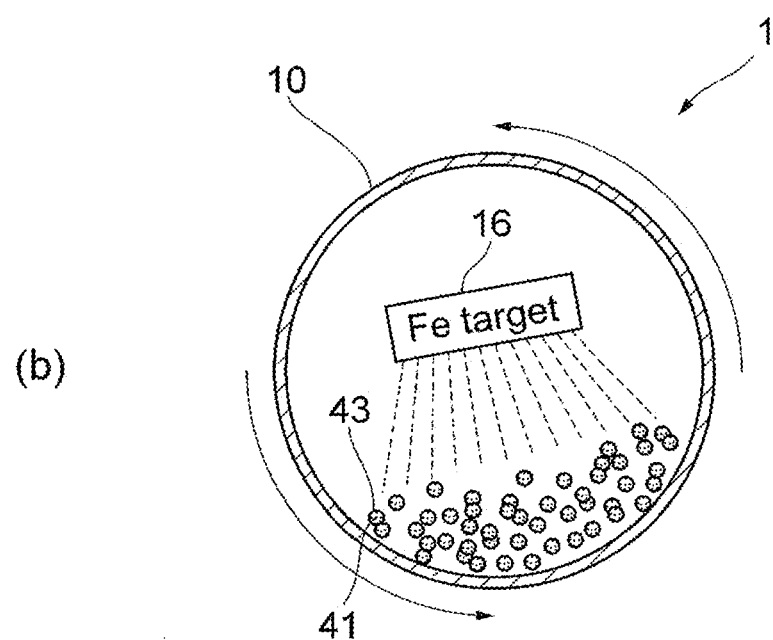

(a)
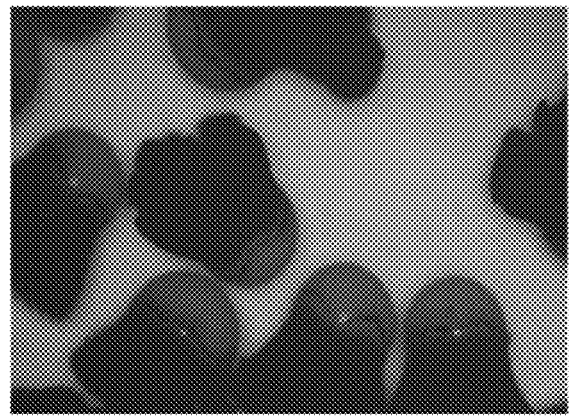
(b)
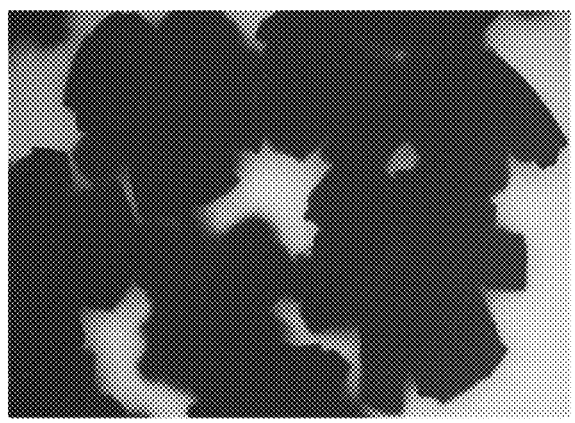
FIG. 13

METHOD FOR MANUFACTURING CATALYST FOR CARBON NANOTUBE SYNTHESIS

TECHNICAL FIELD

The present invention relates to a method for manufacturing a catalyst for carbon nanotube synthesis.

BACKGROUND ART

Carbon nanotubes have been synthesized by using granular carriers (hereinafter called "particulate carriers"). Carbon nanotubes are synthesized using particulate carriers in the following manner. A catalyst for carbon nanotube synthesis is deposited on particulate carriers. The catalyst for carbon nanotube synthesis is then reduced by heating with a reducing gas, such as hydrogen, to be fine-grained. In doing so, the granular catalyst for carbon nanotube synthesis is supported by the particulate carriers. Subsequently, a source gas for carbon nanotubes is flown over the catalyst for carbon nanotube synthesis, whereby carbon nanotubes are synthesized.

In such a method for synthesizing carbon nanotubes, a technique to deposit a catalyst for carbon nanotube synthesis on particulate carriers is important. As techniques to deposit a catalyst for carbon nanotube synthesis on particulate carriers, chemical vapor deposition (CVD) (see Patent Literature 1, for example) and sputtering (see Non Patent Literature 1, for example) have been known.

CITATION LIST

Patent Literature

[Patent Literature 1] Publication No. WO2009/110591

Non Patent Literature

[Non Patent Literature 1] Dong Young Kim, Hisashi Sugime, Kei Hasegawa, Toshio Ogawa, Suguru Noda; Fluidized-bed synthesis of sub-millimeter-long single walled carbon nanotube array; CARBON 50 (2012), 1538-1545

SUMMARY OF INVENTION

Technical Problem

Carbon nanotubes include multi-walled carbon nanotubes (MWCNTs) and single walled carbon nanotubes (SWCNTs). In terms of enhancing characteristics of carbon nanotubes, single walled carbon nanotubes are more preferable than multi-walled carbon nanotubes. In the synthesis of multi-walled carbon nanotubes, the size of a catalyst for carbon nanotube synthesis supported by particulate carriers may be comparatively large. In contrast, in the synthesis of single walled carbon nanotubes, the size of a catalyst for carbon nanotube synthesis supported by particulate carriers needs to be small.

In the use of CVD, however, the size of a catalyst for carbon nanotube synthesis supported by particulate carriers cannot be reduced enough to enable single walled carbon nanotubes to be synthesized. It is thus difficult to synthesize single walled carbon nanotubes.

By contrast, in the use of sputtering, the size of a catalyst for carbon nanotube synthesis supported by particulate carriers can be reduced to the extent that single walled carbon nanotubes can be synthesized. Single walled carbon nanotubes can be thus synthesized readily as compared with the case using CVD.

Conventional sputtering is a method for forming a metal thin film on a flat substrate. A catalyst for carbon nanotube synthesis is thus supported by only a single side of each particulate carrier. For this reason, when conventional sputtering is used, the film thickness of films on which sputtering is performed varies depending on the positions of the surfaces of particulate carriers as FIG. 5(b) illustrates, so that carbon nanotubes cannot be produced uniformly. In addition, carbon nanotubes cannot be synthesized from the entire surfaces of the particulate carriers, resulting in poor production efficiency of carbon nanotubes.

In view of the above-described disadvantages, it is an object of the present invention to provide a method for manufacturing a catalyst for carbon nanotube synthesis, by which single walled carbon nanotubes can be synthesized and production efficiency of carbon nanotubes can be enhanced.

Solution to Problem

As a result of intensive examinations, the inventors of the present invention have fundamentally improved a sputtering method and thus have found that a catalyst for carbon nanotube synthesis can be manufactured with which single walled carbon nanotubes can be synthesized and production efficiency of carbon nanotubes can be enhanced.

Specifically, in one mode, the method for manufacturing a catalyst for carbon nanotube synthesis according to the present invention includes a sputtering step for supporting a catalyst. In this step, sputtering is performed while a tubular drum containing particulate carriers is rotated around the axis. A catalyst for carbon nanotube synthesis is thus deposited on the particulate carriers. The manufacturing of a catalyst for carbon nanotube synthesis indicates a process of depositing a catalyst for carbon nanotube synthesis on particulate carriers, and further indicates a process of reducing the catalyst for carbon nanotube synthesis deposited on the particulate carriers by heating to be fine-grained and causing the particulate carriers to support the catalyst.

In the method for manufacturing a catalyst for carbon nanotube synthesis according to the present invention, sputtering can be performed while particulate carriers are stirred by rotating a drum containing the particulate carriers. A catalyst for carbon nanotube synthesis can be thus deposited on the entire surfaces of the particulate carriers. By reducing the catalyst by heating, the fine-grained catalyst for carbon nanotube synthesis is supported by the entire surfaces of the particulate carriers, which significantly enhances productivity of carbon nanotubes. Furthermore, because the catalyst for carbon nanotube synthesis is deposited on the particulate carriers through sputtering, by reducing the resultant particulate carriers by heating, the size of the fine-grained catalyst for carbon nanotube synthesis supported by the particulate carriers is reduced as compared with the case using CVD. In such a manner, single walled carbon nanotubes can be synthesized.

In the sputtering step for supporting a catalyst in this method, the drum can be swung so that one end portion and the other end portion in the axial direction of the drum are relatively vertically switched. The amount of scattered target atoms sputtering from the sputtering target decreases with distance from the sputtering target. Simple rotation of the drum around the axis does not make the amount of the deposited catalyst for carbon nanotube synthesis uniform in the axial direction of the drum. On account of this, the drum is swung in such a manner, so that the particulate carriers supplied into the drum can be reciprocated in the axial direction of the drum. The amount of the deposited catalyst for carbon nanotube synthesis can be thus entirely uniformed.

In another mode, a particulate carrier supplying chamber may be connected to a vacuum container that houses the drum, a first opening and closing device that opens and closes the space between the vacuum container and the particulate carrier supplying chamber may be provided, and the method may further include a supplying step of supplying the particulate carrier supplying chamber with the particulate carriers in a state where the first opening and closing device is closed, the particulate carrier supplying chamber is brought into a vacuum state, the first opening and closing device is opened, the particulate carriers supplied to the particulate carrier supplying chamber are supplied into the drum, and the first opening and closing device is closed to open the particulate carrier supplying chamber to the atmosphere. In such a manner, the particulate carriers can be supplied into the drum while the vacuum state of the vacuum container is maintained. Furthermore, while the first opening and closing device is closed, the particulate carrier supplying chamber is opened to the atmosphere. The particulate carrier supplying chamber having been in a vacuum state is thus opened to the atmosphere, allowing the first opening and closing device to open and close. This configuration enables the particulate carriers to be supplied to the particulate carrier supplying chamber while sputtering is performed in the vacuum chamber. Sputtering can be thus performed repeatedly without returning the vacuum container to the atmospheric state, which enhances productivity.

The method may further include a recovering step of recovering the particulate carriers from the drum by inclining the drum. In this step, when the drum is inclined, the particulate carriers are discharged from the drum, whereby the particulate carriers can be easily recovered. Furthermore, because swing of the drum is utilized to incline the drum, the particulate carriers can be recovered without adding another function to discharge the particulate carriers from the drum. This configuration can simplify a device performing sputtering.

In another mode, a particulate carrier recovering chamber may be connected below the vacuum container that houses the drum, a second opening and closing device that opens and closes the space between the vacuum container and the particulate carrier recovering chamber may be provided, and the method may further include a recovering step of recovering the particulate carriers from the particulate carrier recovering chamber in which the particulate carrier recovering chamber is brought into a vacuum state, the second opening and closing device is opened, the drum is inclined to drop the particulate carriers in the drum into the particulate carrier recovering chamber, the second opening and closing device is closed, and the particulate carrier recovering chamber is opened to the atmosphere. In such a manner, the particulate carriers can be recovered from the drum while the vacuum state of the vacuum container is maintained. In addition, the second opening and closing device is closed to open the particulate carrier recovering chamber to the atmosphere. The particulate carrier recovering chamber having been in a vacuum state is thus opened to the atmosphere, allowing the second opening and closing device to open and close. This configuration enables the particulate carriers to be recovered from the particulate carrier recovering chamber while sputtering is performed in the vacuum chamber. Sputtering can be thus performed repeatedly without returning the vacuum container to the atmospheric state, which enhances productivity.

Furthermore, in the sputtering step for supporting a catalyst, oxygen may be supplied to the vacuum container that houses the drum. When the drum is rotated around the axis, the particulate carriers may collide with the inner wall of the drum, causing the catalyst for carbon nanotube synthesis deposited on the particulate carriers to fall off. In consideration of this, sputtering is performed while oxygen is supplied into the vacuum container, whereby the catalyst for carbon nanotube synthesis is oxidized to enhance the joint strength to the grained carriers through the oxidization. This configuration can inhibit the catalyst for carbon nanotube synthesis from falling off from the particulate carriers even when the drum is rotated around the axis.

The method may further include a sputtering step for forming catalyst supporting layers of performing sputtering while the drum containing the particulate carriers is rotated around the axis to form catalyst supporting layers for supporting the catalyst for carbon nanotube synthesis on the particulate carriers, before the sputtering step for supporting a catalyst. The sputtering step for forming catalyst supporting layers is thus performed before the sputtering step for supporting a catalyst, so that the catalyst for carbon nanotube synthesis can be properly supported by the particulate carriers.

In the sputtering step for forming catalyst supporting layers, oxygen is preferably supplied into the vacuum container. As described above, when the drum is rotated around the axis, the particulate carriers may collide with the inner wall of the drum, causing the catalyst supporting layers formed on the particulate carriers to fall off. In consideration of this, sputtering is performed while oxygen is supplied into the vacuum container, and thus, the catalyst supporting layers are oxidized to enhance the joint strength to the particulate carriers. This configuration can inhibit the catalyst supporting layers from falling off from the particulate carriers even when the drum is rotated around the axis.

Advantageous Effects of Invention

According to the present invention, a catalyst for carbon nanotube synthesis can be manufactured with which single walled carbon nanotubes can be synthesized and production efficiency of carbon nanotubes can be enhanced.

BRIEF DESCRIPTION OF DRAWINGS

FIGS. 5(a) and 5(b) are schematics for illustrating a method for manufacturing a catalyst for carbon nanotube synthesis using a flat sputtering device.

FIGS. 7(a) and 7(b) are schematics illustrating a manufacturing method in the embodiment.

FIGS. 13(a) and 13(b) are photographs of the synthesized carbon nanotubes.

DESCRIPTION OF EMBODIMENTS

Preferred embodiments of a method for manufacturing a catalyst for carbon nanotube synthesis according to the present invention are described in detail below with reference to the accompanying drawings. In all of the drawings, like numerals refer to like or equivalent components.

[First Embodiment]

In the method for manufacturing a catalyst for carbon nanotube synthesis according to the present embodiment, a catalyst for carbon nanotube synthesis is deposited on (supported by) particulate carriers by sputtering to manufacture the catalyst for carbon nanotube synthesis.

Figure 1:
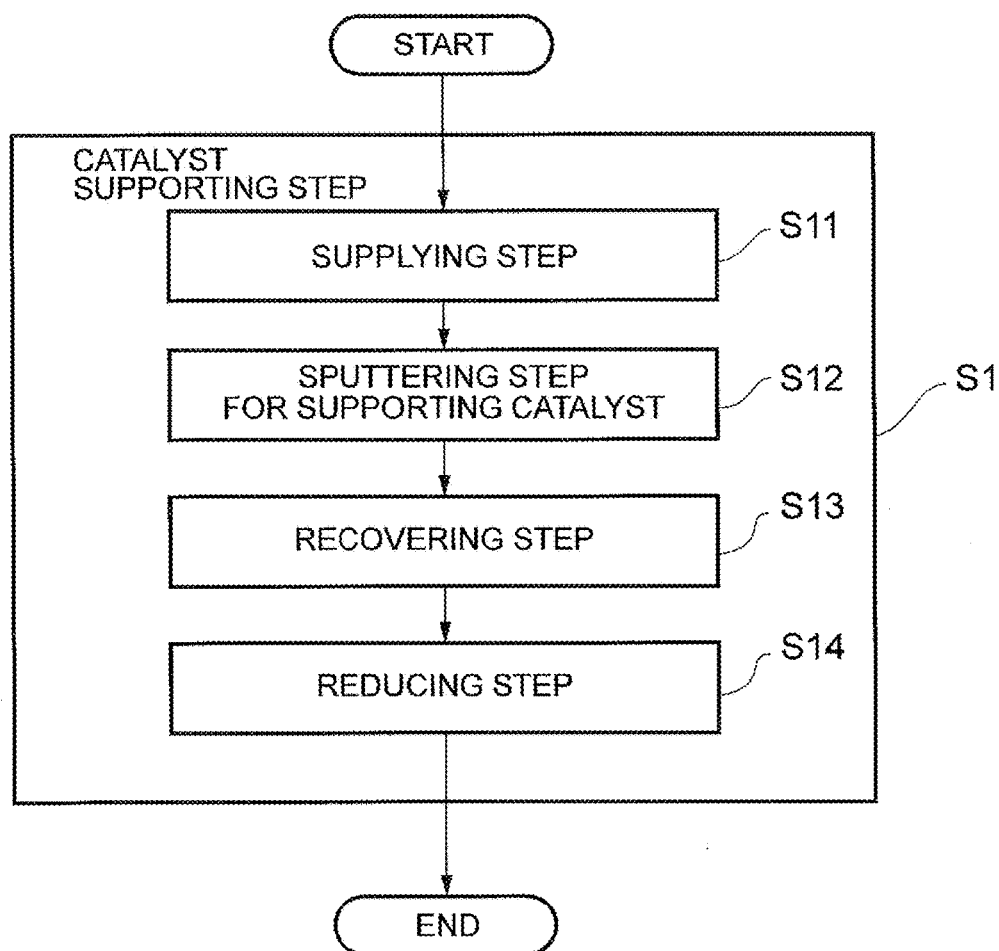
FIG. 1 is a flowchart indicating a method for manufacturing a catalyst for carbon nanotube synthesis according to a first embodiment.

FIG. 1 is a flowchart indicating a method for manufacturing a catalyst for carbon nanotube synthesis according to the first embodiment. As FIG. 1 illustrates, the method for manufacturing a catalyst for carbon nanotube synthesis according to the present embodiment includes a catalyst supporting step (S1) in which a catalyst for carbon nanotube synthesis is deposited on particulate carriers on which catalyst supporting layers are formed.

The particulate carriers are configured with granular heat resistant beads having heat resistance. The material of the particulate carriers preferably includes one or more elements selected from the group consisting of Si, Al, Mg, Zr, Ti, O, N, C, Mo, Ta, and W. Specific examples of the material include oxides such as $SiO_2$, $Al_2O_3$, and MgO, nitrides such as —$Si_3N_4$ and AlN, and carbides such as SiC. The material may also include complex oxides such as $Al_2O_3$—$SiO_2$.

The catalyst for carbon nanotube synthesis is preferably a metal typically used in the synthesis of carbon nanotubes and favorably includes one or more elements selected from Ti, Ta, V, Cr, Fe, Co, Ni, W, and Au. Among these, Fe, Co, and Ni each having a large solid soluble amount with carbon are particularly preferable.

The catalyst supporting layers including one or more elements selected from Si, Al, Mg, O, C, Mo, and N are favorable. Among these, forms in oxides such as $SiP_2$, $Al_2O_3$ and MgO, nitrides such as $Si_3N_4$ and AlN, and carbides such as SiC are favorable. The catalyst supporting layers may also be a complex oxide such as $Al_2O_3$—$SiO_2$.

[Drum Sputtering Device]

A drum sputtering device used in the catalyst supporting step (S1) will be described.

Figure 2:
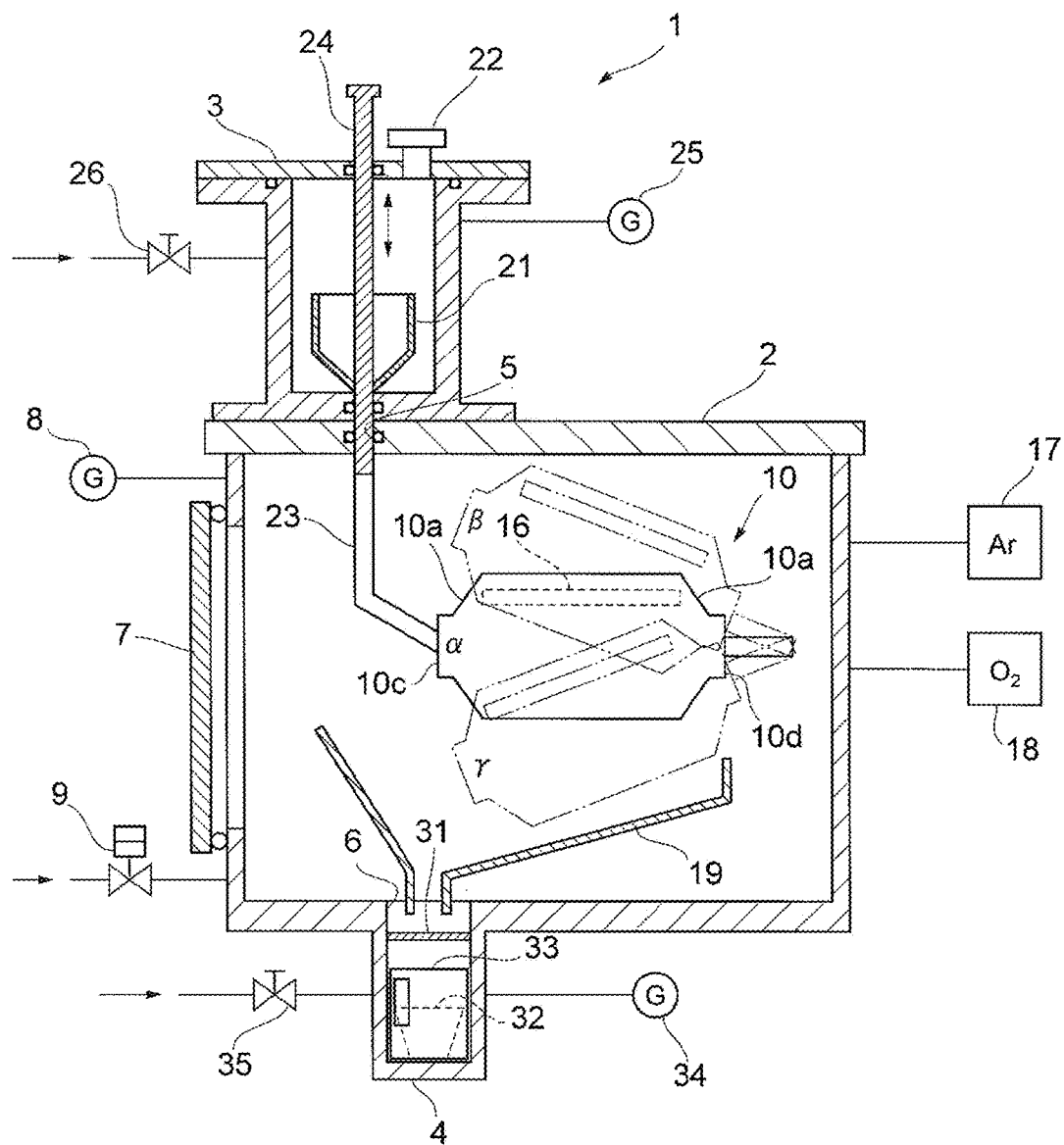
FIG. 2 is a longitudinal sectional diagram of a drum sputtering device.
Figure 3:
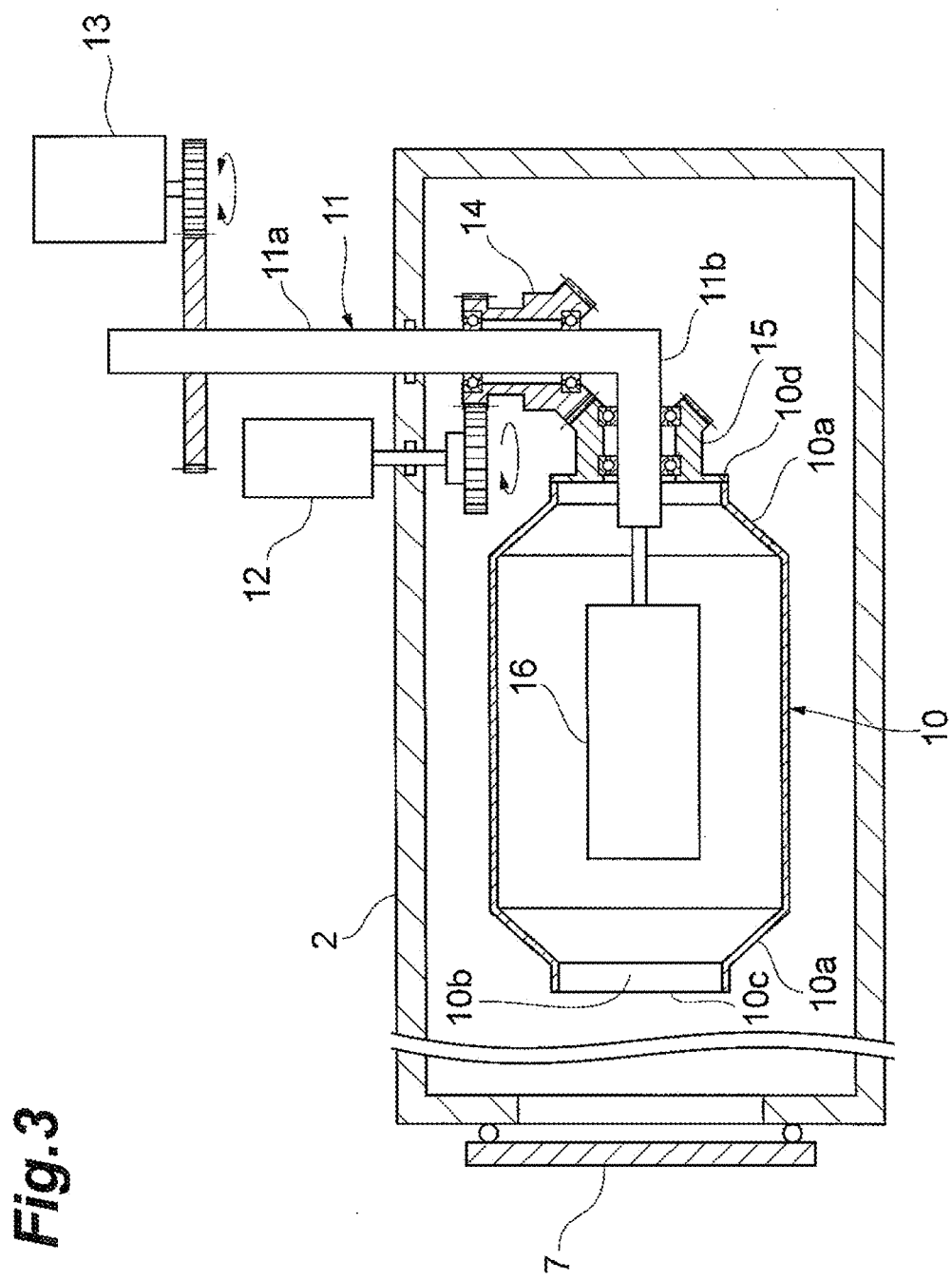
FIG. 3 is a cross sectional diagram of the drum sputtering device.

FIG. 2 is a longitudinal sectional diagram of a drum sputtering device. FIG. 3 is a cross sectional diagram of the drum sputtering device. As FIGS. 2 and 3 illustrate, this drum sputtering device 1 includes a vacuum container 2 in which sputtering is performed, a particulate carrier supplying chamber 3 that is connected to the vacuum container 2 and is configured to supply particulate carriers into the vacuum container 2, and a particulate carrier recovering chamber 4 that is connected to the vacuum container 2 and is configured to recover the particulate carriers from the vacuum container 2. An upper communication opening 5 that communicates between the vacuum container 2 and the particulate carrier supplying chamber 3 is formed at a position between the vacuum container 2 and the particulate carrier supplying chamber 3. A lower communication opening 6 that communicates between the vacuum container 2 and the particulate carrier recovering chamber 4 is formed at a position between the vacuum container 2 and the particulate carrier recovering chamber 4.

The vacuum container 2 is provided with a main hatch 7 for opening and closing the vacuum container 2. The vacuum container 2 is also connected to a vacuum pump 8 that sucks the air in the vacuum container 2 into a vacuum and a leak valve 9 for supplying air into the vacuum container 2 having been in a vacuum state. With this configuration, the inside of the vacuum container 2 can be brought into a vacuum state by closing the main hatch 7 and sucking the air in the vacuum container 2 into a vacuum by the vacuum pump 8. Air is supplied through the leak valve 9 into the vacuum container 2 having been in a vacuum state. The vacuum container 2 is then returned to the atmospheric state, allowing the main hatch 7 to open and close.

A drum 10 that is configured to contain particulate carriers is arranged inside the vacuum container 2.

The drum 10 has a tubular shape with which particulate carriers can be contained therein and is arranged so that the central axis (hereinafter simply called the "axis") of the drum 10 is oriented to the horizontal direction. The shape of the drum 10 is not particularly limited to a tubular shape and may be, for example, a cylindrical shape or a square tubular shape. The inner surface shape of the drum 10 is also not particularly limited and may be, for example, circular or polygonal in cross section. A member such as a stirring plate that stirs the particulate carriers may also be attached to the inner surface of the drum 10. Both end portions 10a of the drum 10 in the axial direction are constricted (reduced in the diameter) into a funnel shape so as not to drop off the contained particulate carriers therefrom. An opening 10b that is configured to supply particulate carriers into the drum 10 is formed at one end face 10c in the axial direction of the drum 10. The other end face 10d that opposes the opening 10b in the axial direction of the drum 10 may or may not be opened.

The drum 10 is pivotally supported to be rotatable around the axis and also pivotally supported to be vertically tiltable with a substantially L-shaped supporting arm 11 that extends from the side wall of the vacuum container 2. The drum sputtering device 1 includes, outside the vacuum container 2, a drive motor 12 for rotation that rotationally drives the drum 10 around the axis and a drive motor 13 for swing that swingingly drives the drum 10 to tilt vertically.

Specifically, the supporting arm 11 includes a base end arm portion 11a that perpendicularly extends from the side wall of the vacuum container 2 and a leading end arm portion 11b that is bended at the tip of the base end arm portion 11a at a right angle. The base end arm portion 11a is pivotally supported so as to be rotatable around the axis of the base end arm portion 11a against the vacuum container 2.

The base end arm portion 11a is directly or indirectly engaged with the drive shaft of the drive motor 13 for swing so that the axis of the drive shaft of the drive motor 13 for swing is arranged in parallel with the axis of the base end arm portion 11a. The leading end arm portion 11b extends in the direction corresponding to the axis of the drum 10, and its tip is inserted into the drum 10.

The base end arm portion 11a is coupled to a circular first gear member 14 with a bearing, such as a ball bearing, interposed therebetween. With this configuration, the base end arm portion 11a and the first gear member 14 are coupled to be mutually rotatable in a direction around the axis of the base end arm portion 11a. The drive shaft of the drive motor 12 for rotation is directly or indirectly engaged with the first gear member 14 so that the axis of the drive shaft of the drive motor 12 for rotation is arranged in parallel with the axis of the base end arm portion 11a.

The leading end arm portion 11b is coupled to a circular second gear member 15 with a bearing, such as a ball bearing, interposed therebetween. With this configuration, the leading end arm portion 11b and the second gear member 15 are coupled to be mutually rotatable in a direction around the axis of the leading end arm portion 11b. The second gear member 15 is fixed at the other end face 10d of the drum 10 so that the axis of the drum 10 corresponds to the axis of the leading end arm portion 11b.

Bevel gears are formed in the first gear member 14 and the second gear member 15, respectively, the bevel gears transmitting rotation between the two shafts that are orthogonal to each other. The first gear member 14 is engaged with the second gear member 15 using these bevel gears.

With this configuration, when the drive shaft of the drive motor 12 for rotation is rotationally driven, this rotational driving is transmitted to the drum 10 via the first gear member 14 and the second gear member 15. The drum 10 then rotates around the axis.

Furthermore, when the drive shaft of the drive motor 13 for swing is rotationally driven, the base end arm portion 11a rotates in a direction around the axis of the base end arm portion 11a. The leading end arm portion 11b is then tilted so that the connecting point with the base end arm portion 11a serves as the central axis. Following this movement, the drum 10 is vertically tilted so that the connecting point between the base end arm portion 11a and the leading end arm portion 11b serves as the central axis. When the rotational direction of the driving shaft of the drive motor 13 for swing is reversed during this operation, the tilting direction of the drum 10 is vertically reversed. While the drive shaft of the drive motor 13 for swing is rotationally driven, the rotational direction of the drive shaft of the drive motor 13 for swing is reversed every time the angle of the tilted drum 10 reaches a given angle. The drum 10 is thus swung so that the one end portion and the other end portion in the axial direction are relatively vertically switched.

Figure 4:
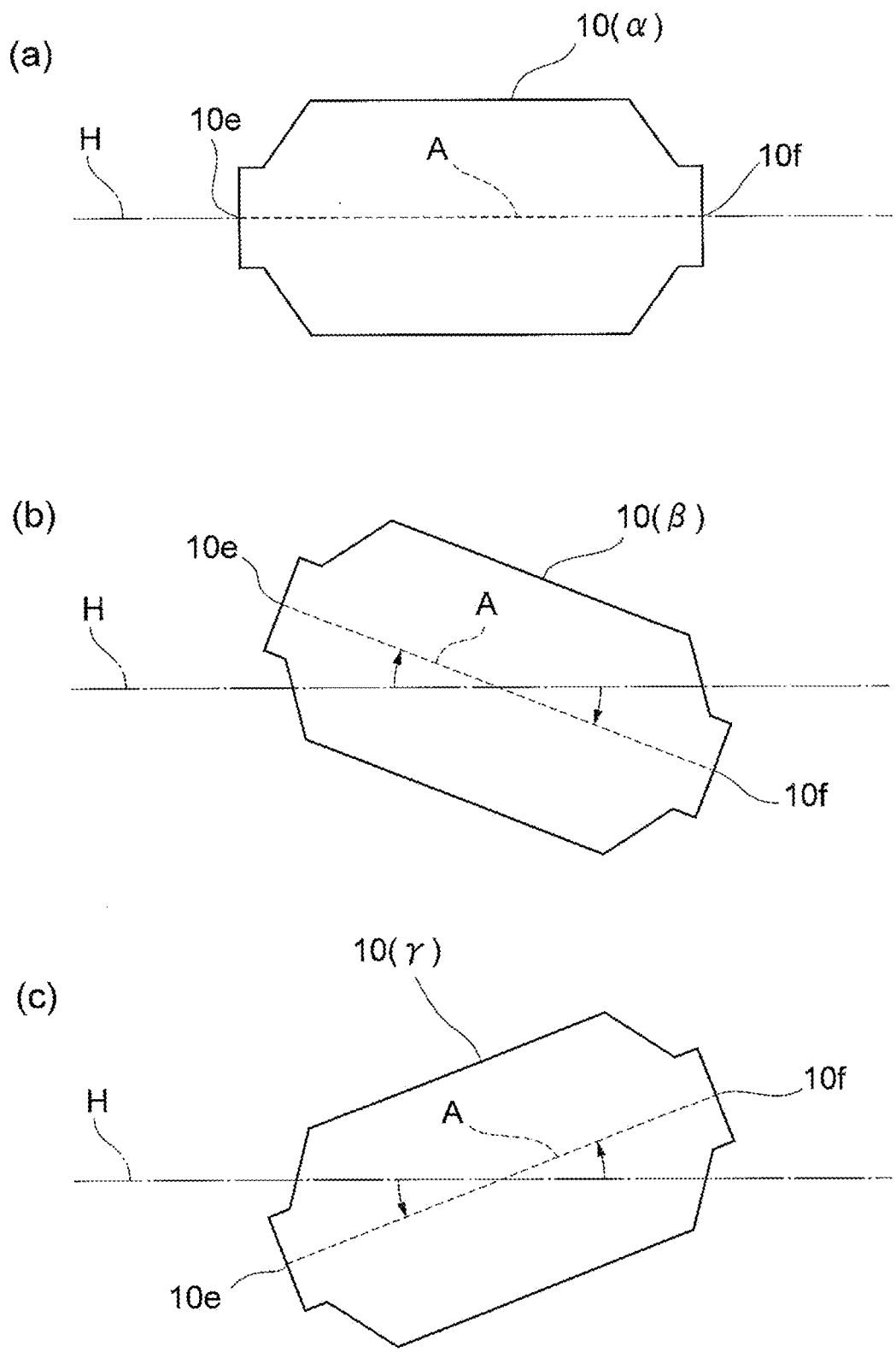
FIGS. 4(a) to 4(c) are elevation schematics illustrating the positions of the drum.

The swing of the drum 10 is described herein in more detail also with reference to FIG. 4. FIGS. 4(a) to 4(c) are elevation schematics illustrating the positions of the drum. In FIG. 4, a reference sign A denotes the axis of the drum 10, and a reference sign H denotes the horizontal axis passing through the center of the drum 10 in the axial direction.

A horizontal position α (FIG. 4(a)) will be described. In the drum 10 with this position, the axis A and the horizontal axis H overlap, and the one end portion 10e in the axial direction of the drum 10 and the other end portion 10f in the axial direction of the drum 10 become the same in height.

In this position, when the drive shaft of the drive motor 13 for swing is rotationally driven, the drum 10 is tilted so that the one end portion 10e moves upward from the horizontal axis H while the other end portion 10f moves downward from the horizontal axis H. The axis A of the drum 10 is thus inclined with respect to the horizontal axis H, resulting in a first inclined position β (FIG. 4(b)) in which the one end portion 10e is higher than the other end portion 10f.

Subsequently, the rotational direction of the drive shaft of the drive motor 13 for swing is reversed, and then, the drive shaft of the drive motor 13 for swing is rotationally driven. The drum 10 is then tilted so that the one end portion 10e and the other end portion 10f move closer to the horizontal axis H. The drum 10 is thus returned back to the horizontal position α (FIG. 4(a)). Furthermore, when the drive shaft of the drive motor 13 for swing is rotationally driven in the same rotational direction, the drum 10 is tilted so that the one end portion 10c moves downward from the horizontal axis H while the other end portion 10f moves upward from the horizontal axis H. The axis A of the drum 10 is thus inclined with respect to the horizontal axis H, resulting in a second inclined position γ (FIG. 4(c)) in which the one end portion 10e is lower than the other end portion 10f.

Subsequently, the rotational direction of the drive shaft of the drive motor 13 for swing is reversed, and then, the drive shaft of the drive motor 13 for swing is rotationally driven. The drum 10 is then tilted so that the one end portion 10e and the other end portion 10f move closer to the horizontal axis H. The drum 10 is thus returned back to the horizontal position α (FIG. 4(a)).

In such a manner, the drive shaft of the drive motor 13 for swing is rotationally driven, and the rotational direction of the drive shaft of the drive motor 13 for swing is reversed every time the angle of the tilted drum 10 reaches a given angle. The position of the drum 10 is shifted to (1) the horizontal position α, (2) the first inclined position β, (3) the horizontal position α, (4) the second inclined position γ, and (5) the horizontal position α, in this order. This cycle from (1) to (5) is repeated. With this repetition, the drum 10 swings so that the one end portion 10e and the other end portion 10f in the axial direction are relatively vertically switched.

A sputtering target 16 is arranged inside the drum 10 having such a configuration. The sputtering target 16 is formed into a plate of a metal from which catalyst supporting layers are formed or a metal from which a catalyst for carbon nanotube synthesis is formed. The sputtering target 16 is arranged so as to be attachable to and detachable from the leading end arm portion 11b that is inserted into the drum 10. With this configuration, the sputtering target 16 follows only the swing of the drum 10 and does not follow the rotation of the drum 10 around the axis. The sputtering target 16 may be arranged at any position inside the drum 10. In terms of efficiently forming the catalyst supporting layers or the catalyst for carbon nanotube synthesis on the particulate carriers, the sputtering target 16 is preferably arranged at the center of the drum 10 in the axial direction.

A guiding member 19 with a substantially funnel shape that guides the particulate carriers discharged from the drum 10 into the lower communication opening 6 is attached to the inside of the vacuum container 2.

A sputtering gas supplying device 17 that supplies a sputtering gas for causing the sputtering target 16 to sputter, into the vacuum container 2 and an oxygen supplying device 18 that supplies oxygen into the vacuum container 2 are connected to the vacuum container 2. The sputtering gas supplying device 17 and the oxygen supplying device 18 may be integrally configured. In this configuration, a sputtering gas and oxygen are supplied into the vacuum container 2 in a mixed state.

The sputtering gas may be any gas so long as it is an inert gas that can cause the sputtering target 16 to sputter but is preferably argon gas in terms of sputtering efficiency.

The particulate carrier supplying chamber 3 is configured to supply particulate carriers into the drum 10 and is arranged at the top of the vacuum container 2.

A particulate carrier supplying container 21 that stores particulate carriers is installed inside the particulate carrier supplying chamber 3. A supply door 22 that is opened and closed for supplying the particulate carriers to the particulate carrier supplying container 21 is attached to the top of the particulate carrier supplying chamber 3.

A supply nozzle 23 for supplying the particulate carriers supplied to the particulate carrier supplying container 21 into the drum 10 is attached to the particulate carrier supplying container 21. The supply nozzle 23 extends from the particulate carrier supplying container 21 to the opening 10b of the drum 10 through the upper communication opening 5. The supply nozzle 23 is hermetically connected to the upper communication opening 5. The vacuum container 2 is communicated to the particulate carrier supplying container 21 only through the supply nozzle 23.

A supply mechanism 24 that is inserted into and removed from the supply nozzle 23 through the particulate carrier supplying container 21 is provided at the particulate carrier supplying chamber 3. The supply mechanism 24 is formed into a bar shape that vertically extends, and its upper portion passes through the particulate carrier supplying chamber 3 and is exposed to the outside of the particulate carrier supplying chamber 3. The supply mechanism 24 is hermetically slidable against the particulate carrier supplying chamber 3 and can be inserted into and removed from the supply nozzle 23. With this configuration, when the supply mechanism 24 is pulled up, the supply nozzle 23 is opened. The particulate carriers stored in the particulate carrier supplying container 21 are then supplied into the drum 10 through the supply nozzle 23. In contrast, when the supply mechanism 24 is pushed down, the supply nozzle 23 is closed. The supplying of the particulate carriers into the drum 10 is then stopped, and the space between the particulate carrier supplying chamber 3 and the vacuum container 2 are hermetically maintained.

A vacuum pump 25 that sucks the air in the particulate carrier supplying chamber 3 into a vacuum and a leak valve 26 for supplying air into the particulate carrier supplying chamber 3 having been in a vacuum state are connected to the particulate carrier supplying chamber 3. With this configuration, the inside of the particulate carrier supplying chamber 3 can be brought into a vacuum state by closing the supply door 22, inserting the supply mechanism 24 into the supply nozzle 23, and sucking the air in the particulate carrier supplying chamber 3 into a vacuum by the vacuum pump 25. In addition, air is supplied through the leak valve 26 into the particulate carrier supplying chamber 3 having been in a vacuum state. The particulate carrier supplying chamber 3 is then returned to the atmospheric state, allowing the supply door 22 to open and close.

The particulate carrier recovering chamber 4 is configured to recover the particulate carriers discharged from the inside of the drum 10 and is arranged below the vacuum container 2 and directly below the opening 10b of the drum 10. A door 31 for the lower communication opening that hermetically opens and closes the lower communication opening 6 communicating between the vacuum container 2 and the particulate carrier recovering chamber 4 is attached to the lower communication opening 6.

A particulate carrier recovering container 32 that recovers the particulate carriers is installed inside the particulate carrier recovering chamber 4. A recovery door 33 that is opened and closed for loading and unloading the particulate carrier recovering container 32 is attached to the side face of the particulate carrier recovering chamber 4.

A vacuum pump 34 that sucks the air in the particulate carrier recovering chamber 4 into a vacuum and a leak valve 35 for supplying air into the particulate carrier recovering chamber 4 having been in a vacuum state are connected to the particulate carrier recovering chamber 4. With this configuration, the inside of the particulate carrier recovering chamber 4 can be brought into a vacuum state by closing the door 31 for the lower communication opening and the recovery door 33, and sucking the air in the particulate carrier recovering chamber 4 into a vacuum by the vacuum pump 34. In addition, air is supplied through the leak valve 35 into the particulate carrier recovering chamber 4 having been in a vacuum state. The particulate carrier recovering chamber 4 is then returned to the atmospheric state, allowing the recovery door 33 to open and close.

[Catalyst Supporting Step (S1)]

The catalyst supporting step (S1) in the method for manufacturing a catalyst for carbon nanotube synthesis according to the present embodiment is described below in more detail.

In the catalyst supporting step (S1), the drum sputtering device 1 on which the sputtering target 16 is installed is prepared. The sputtering target 16 is formed from a material from which a catalyst for carbon nanotube synthesis is to be formed.

As FIGS. 1 to 3 illustrate, in the catalyst supporting step (S1), a supplying step (S11) in which the particulate carriers are supplied into the drum 10 is performed.

The average particle diameter of the particulate carriers in the supplying step (S11) may be 5 µm or larger. In this case, the average particle diameter of the particulate carriers is preferably 20 µm or larger and further preferably 100 µm or larger. When the average particle diameter of the particulate carriers is 5 µm or larger, the particulate carriers are not likely to be aggregated. In addition, even when the drum 10 is rotated, the particulate carriers are allowed to stay near the bottom of the drum 10, which can enhance stirring efficiency of the particulate carriers. Furthermore, when the average particle diameter of the particulate carriers is 20 µm or larger and further 100 µm or larger, this effect is further enhanced. Here, the maximum of the average particle diameter of the particulate carriers can be appropriately set to the extent that the particulate carriers can be stirred in the drum 10.

In the supplying step (S11), the supply mechanism 24 is pushed down to close the supply nozzle 23, and the particulate carriers are supplied from the supply door 22 to the particulate carrier supplying container 21. The supply door 22 is then closed, and the vacuum pump 25 sucks the air in the particulate carrier supplying chamber 3 into a vacuum. Subsequently, the supply mechanism 24 is pulled up to open the supply nozzle 23, and the particulate carriers supplied to the particulate carrier supplying container 21 are supplied through the supply nozzle 23 into the drum 10. With this configuration, when the vacuum container 2 is in a vacuum state, the particulate carriers can be supplied into the drum 10 while the vacuum container 2 is kept in the vacuum state. When the supplying step (S11) is performed for the first time, and the vacuum container 2 is in the atmospheric state, there is no need for the vacuum pump 25 to suck the air in the particulate carrier supplying chamber 3 into a vacuum. After the supplying of the particulate carriers into the drum 10 is completed, the supply mechanism 24 is pushed down to close the supply nozzle 23. Air is then supplied through the leak valve 26 into the particulate carrier supplying chamber 3, whereby the particulate carrier supplying chamber 3 having been in a vacuum state is opened to the atmosphere. The particulate carrier supplying chamber 3 is thus prepared for the subsequent supply of particulate carriers.

Subsequently, in the catalyst supporting step (S1), a sputtering step (S12) for supporting a catalyst is performed in which the catalyst for carbon nanotube synthesis is deposited on the particulate carriers supplied into the drum 10.

In the sputtering step (S12) for supporting a catalyst, the vacuum pump 8 sucks the air in the vacuum container 2 into a vacuum. During this operation, the supply mechanism 24 and the door 31 for the lower communication opening are closed to hermetically maintain the inside of the vacuum container 2. When the sputtering step (S12) for supporting a catalyst at this time is the second time or more, and the inside of the vacuum container 2 is already maintained in a vacuum state, there is no need for the vacuum pump 8 to suck the air in the vacuum container 2 into a vacuum. An operation to suck the air in the vacuum container 2 into a vacuum in the sputtering step (S12) for supporting a catalyst can be performed concurrently with an operation to open the particulate carrier supplying chamber 3 to the atmosphere in the supplying step (S11). Subsequently, the drum 10 is rotated around the axis and also is swung so that the one end portion 10e and the other end portion 10f are relatively vertically switched by driving the drive motor 12 for rotation and the drive motor 13 for swing.

The rotational speed of the drum 10 is not particularly limited but may be, for example, from 0.1 rpm or higher and 60.0 rpm or lower. In this case, the rotational speed of the drum 10 is preferably 0.5 rpm or higher and 30.0 rpm or lower and more preferably 1.0 rpm or higher and 20.0 rpm or lower.

Although the drum 10 favorably has a high rotational speed in respect of stirring properties, the drum 10 favorably has a low rotational speed in respect of falling off of the catalyst for carbon nanotube synthesis. The upper limit of the rotational speed varies depending on the size or the specific gravity of the particulate carriers, or the amount of the particulate carriers filling the drum 10, but is preferably 60.0 rpm or lower in order to prevent the particulate carriers from rotating together with the drum 10 and not dropping. The upper limit of the rotational speed is more preferably 30.0 rpm or lower in order to prevent the particulate carriers from floating in the drum 10, being deposited on a target electrode part (not shown), and causing a short circuit. The most preferable upper limit of the rotational speed is 20.0 rpm or lower in order to prevent the particulate carriers from colliding with the inner wall of the drum 10 and causing the catalyst for carbon nanotube synthesis to fall off from the particulate carriers. The lower limit of the rotational speed is preferably 0.1 rpm or higher in order to prevent the particulate carriers from being deposited on the inner wall of the drum 10 and being not able to be stirred. The lower limit of the rotational speed is more preferably 0.5 rpm or higher and further preferably 1.0 rpm or higher in order to uniformly form the catalyst for carbon nanotube synthesis on the whole surfaces of the particulate carriers.

With this configuration, the particulate carriers are prone to fly in the rotational direction of the drum 10 in accordance with the increase in the rotational speed of the drum 10. Under the circumstances, an angle changing mechanism that changes the installation angle of the sputtering target 16 is preferably provided on, for example, the leading end arm portion 11b of the supporting arm 11, on which the sputtering target 16 is installed. In the sputtering step (S12) for supporting a catalyst, the installation angle of the sputtering target 16 is preferably changed by the angle changing mechanism depending on the rotational speed of the drum 10. With this mechanism, the catalyst for carbon nanotube synthesis can be efficiently deposited on all over the particulate carriers with reliability even if the rotational speed of the drum 10 increases.

The maximum inclination angle of the drum 10 can be appropriately set to the extent that the particulate carriers do not drop from the inside of the drum 10 and may be, for example, 0.5° or larger and 45.0° or smaller. In this setting, the maximum inclination angle of the drum 10 is preferably 1.0° or larger and 30.0° or smaller and is further preferably 3.0° or larger and 15.0° or smaller. The maximum inclination angle of the drum 10, herein, indicates the maximum inclination angle of the axis A with the horizontal axis H (see FIG. 4).

If the maximum inclination angle of the drum 10 is excessively small, the particulate carriers do not move. Even if the particulate carriers move, the moving speed is low, resulting in the decrease in the swing number of the drum 10 in the sputtering step (S12) for supporting a catalyst. In consideration of this situation, when the maximum inclination angle of the drum 10 is set to 0.5° or larger, the movement of the particulate carriers in the axial direction of the drum 10 is promoted, and the moving speed increases. The swing number of the drum 10 can be thus increased in the sputtering step (S12) for supporting a catalyst. With this angle, the catalyst for carbon nanotube synthesis is readily uniformly deposited on all over the particulate carriers. Moreover, when the maximum inclination angle of the drum 10 is set to 1.0° or larger and further 2.0° or larger, this effect is further enhanced.

In contrast, if the maximum inclination angle of the drum 10 is excessively large, the moving speed of the particulate carriers becomes excessively high, and thus, the particulate carriers are prone to fall from the opening 10b of the drum 10. In addition, because the amount of the particulate carriers filling the drum 10 cannot be increased, sputtering is performed not on the particulate carriers but on the inner wall of the drum 10, which induces dirt of and flaking from the drum 10. In consideration of this situation, when the maximum inclination angle of the drum 10 is set to 45.0° or smaller, the moving speed of the particulate carriers can be inhibited from becoming excessively high, and the particulate carriers can be inhibited from falling through the opening 10b of the drum 10. With this speed, the amount of the particulate carriers filling the drum 10 can be increased, and thus, the dirt of and flaking from the drum 10 can be reduced. Moreover, when the maximum inclination angle of the drum 10 is set to 30.0° or smaller and further 15.0° or smaller, this effect is further enhanced.

The moving speed of the particulate carriers in the axial direction of the drum 10 is not particularly limited but may be, for example, 0.5 cm/s or higher and 50.0 cm/s or lower. In this case, the moving speed of the particulate carriers is preferably 1.0 cm/s or higher and 30.0 cm/s or lower and further preferably 2.0 cm/s or higher and 20.0 cm/s or lower. The moving speed of the particulate carriers can be adjusted with the inclination angle of the drum 10. With a moving speed of the particulate carriers of 0.5 cm/s or higher, the swing number of the drum 10 can be increased in the sputtering step (S12) for supporting a catalyst. With this angle, the catalyst for carbon nanotube synthesis is readily uniformly deposited on all over the particulate carriers. Moreover, when the moving speed of the drum 10 is set to 1.0 cm/s or higher and further 2.0 cm/s or higher, this effect is further enhanced. When the moving speed of the particulate carriers is set to 50.0 cm/s or lower, the particulate carriers can be inhibited from falling through the opening 10b of the drum 10. With this speed, the amount of the particulate carriers filling the drum 10 can be increased, and thus, the dirt of and flaking from the drum 10 can be reduced. Moreover, when the moving speed of the drum 10 is set to 30.0 cm/s or lower and further 20.0 cm/s or lower, this effect is further enhanced.

The swing cycle of the drum 10 is not particularly limited but may be, for example, 2 seconds or more and 120 seconds or less. In this case, the swing cycle of the drum 10 is preferably 5 seconds or more and 60 seconds or less and further preferably 10 seconds or more and 30 seconds or less. The swing cycle of the drum 10, herein, indicates a time during which the drum 10 is swung so that the one end portion 10e and the other end portion 10f are relatively vertically switched, as one cycle. In other words, the swing cycle indicates a time from when the drum 10 takes the horizontal position α, the first inclined position β, the horizontal position α, and the second inclined position γ in this order till when the drum 10 returns back to the horizontal position α. When the swing cycle of the drum 10 is set to 2 seconds or more, the moving area of the particulate carriers in the axial direction of the drum 10 expands, and thus, the catalyst for carbon nanotube synthesis is readily formed on all over the particulate carriers. Moreover, when the swing cycle of the drum 10 is set to 5 seconds or more and further 10 seconds or more, this effect is further enhanced. When the swing cycle of the drum 10 is set to 120 seconds or less, the retention time of the particulate carriers at the end portion of the drum 10 in the axial direction becomes short. The catalyst for carbon nanotube synthesis can be thus uniformly deposited on each of the particulate carriers. Moreover, when the swing cycle of the drum 10 is set to 60 seconds or less and further 30 seconds or less, this effect is further enhanced.

In the use of Fe as the catalyst for carbon nanotube synthesis, the film thickness of the catalyst for carbon nanotube synthesis formed on the particulate carriers is preferably 0.1 nm or larger and 10.0 nm or smaller, further preferably 0.2 nm or larger and 5.0 nm or smaller, and still further preferably 0.5 nm or larger and 2.0 nm or smaller. When supporting layers of Al are formed on the particulate carriers, setting the film thickness of the catalyst for carbon nanotube synthesis to 0.1 nm or larger allows a catalyst for carbon nanotube synthesis of Fe to be readily introduced into the supporting layers of Al and to be readily formed into particles. The catalyst for carbon nanotube synthesis can be thus provided in high density. Also when supporting layers of Al are formed on the particulate carriers, the film thickness of the catalyst for carbon nanotube synthesis is set to 10 nm or smaller. With this configuration, a catalyst for carbon nanotube synthesis of Fe is grained, thereby enabling carbon nanotubes to grow. Furthermore, when this film thickness is set to 5 nm or smaller, carbon nanotubes can be grown to be long, and when the film thickness is set to 2 nm or smaller, single walled carbon nanotubes can be grown. The thickness of the catalyst for carbon nanotube synthesis can be measured for example, through observation of a section of a particulate carrier with a scanning electron microscope (SEM).

Sputtering the sputtering target 16 is performed while the sputtering gas supplying device 17 and the oxygen supplying device 18, respectively, supply a sputtering gas and oxygen to the vacuum container 2. The supplying of oxygen to the vacuum container 2 is not essential, but oxidization of the catalyst for carbon nanotube synthesis enhances the joint strength to the particulate carriers, therefore oxygen is preferably supplied to the vacuum container 2 in a small amount together with a sputtering gas. The ratio of oxygen to the sputtering gas is not particularly limited but can be, for example, 0.1% or higher and 20.0% or lower. In this case, the ratio of oxygen to the sputtering gas is preferably 0.5% or higher and 15.0% or lower and further preferably 1.0% or higher and 10.0% or lower. When the ratio of oxygen to the sputtering gas is 0.1% or higher, the joint strength of the catalyst for carbon nanotube synthesis to the particulate carriers can be enhanced. Moreover, when the ratio of oxygen to the sputtering gas is 0.5% or higher and further 1.0% or higher, this effect is enhanced. When the ratio of oxygen to the sputtering gas is 20.0% or lower, the efficiency of sputtering can be maintained. Moreover, when the ratio of oxygen to the sputtering gas is 15.0% or lower and further 10.0% or lower, stable sputtering is possible even during a low-power operation.

After a given setting time has passed, the sputtering is ended, and the driving of the drive motor 12 for rotation and the drive motor 13 for swing are stopped.

Subsequently, in the catalyst supporting step (S1), a recovering step (S13) in which the particulate carriers are recovered is performed.

In the recovering step (S13), the recovery door 33 is closed, and then, the air in the particulate carrier recovering chamber 4 is sucked into a vacuum by the vacuum pump 34. An operation to suck the air in the particulate carrier recovering chamber 4 into a vacuum in the recovering step (S13) can be performed concurrently with each operation in the sputtering step (S12) for supporting a catalyst. Subsequently, the door 31 for the lower communication opening is opened. The drive motor 13 for swing is then driven to incline the drum 10 so that the opening 10b is directed downward. The particulate carriers in the drum 10 are then discharged through the opening 10b and are guided with the guiding member 19 to enter the particulate carrier recovering container 32 installed in the particulate carrier recovering chamber 4. Subsequently, the door 31 for the lower communication opening is closed. Air is supplied through the leak valve 35 into the particulate carrier recovering chamber 4 to open the particulate carrier recovering chamber 4 having been in a vacuum state to the atmosphere. After the particulate carrier recovering chamber 4 is returned to the atmospheric state, the recovery door 33 is opened to take out the particulate carrier recovering container 32 containing the particulate carriers from the particulate carrier recovering chamber 4. With this operation, the particulate carriers can be recovered from the inside of the drum 10 while the vacuum state of the vacuum container 2 is maintained.

Subsequently, in the catalyst supporting step (S1), a reducing step (S14) is performed, in which the catalyst for carbon nanotube synthesis is reduced by heating using a reducing gas, such as hydrogen. In this step, the catalyst for carbon nanotube synthesis is markedly reduced in size, and the size-reduced catalyst for carbon nanotube synthesis is supported by the entire surfaces of the catalyst supporting layers formed on the particulate carriers.

After the completion of the catalyst supporting step (S1), a synthesizing step is performed in which a source gas for carbon nanotubes is flown over the catalyst for carbon nanotube synthesis supported by the catalyst supporting layers on the particulate carriers. In this step, carbon nanotubes are synthesized on the catalyst for carbon nanotube synthesis, and these carbon nanotubes radially grow from the entire surfaces of the particulate carriers.

As described above, in the method for manufacturing a catalyst for carbon nanotube synthesis according to the present embodiment, sputtering can be performed while particulate carriers are stirred by rotating the drum 10 to which the particulate carriers are supplied. The catalyst for carbon nanotube synthesis can be thus deposited on the entire surfaces of the particulate carriers. By reducing the catalyst by heating, the fine-grained catalyst for carbon nanotube synthesis is supported by the entire surfaces of the particulate carriers, which significantly enhances productivity of carbon nanotubes. Furthermore, because the catalyst for carbon nanotube synthesis is supported by the particulate carriers through sputtering, by reducing the resultant particulate carriers by heating, the size of the fine-grained catalyst for carbon nanotube synthesis supported by the particulate carriers is reduced as compared with the case using CVD. In such a manner, single walled carbon nanotubes can be synthesized.

Sputtering is performed while the drum 10 is swung, so that the particulate carriers supplied into the drum 10 can be reciprocated in the axial direction of the drum. The amount of the supported catalyst for carbon nanotube synthesis can be thus entirely uniformed.

In addition, when the drum 10 is inclined, the particulate carriers are discharged from the drum 10, whereby the particulate carriers can be easily recovered. Furthermore, because the drum 10 can be inclined by utilizing the vertical tilt of the drum 10, the particulate carriers can be recovered without adding another function to discharge the particulate carriers from the drum 10. This configuration can simplify the drum sputtering device 1.

Sputtering is performed also while oxygen is supplied into the vacuum container 2, and thus, the catalyst for carbon nanotube synthesis is oxidized to enhance the joint strength to the particulate carriers. This configuration can inhibit the catalyst for carbon nanotube synthesis from falling off from the particulate carriers even when sputtering is performed while the drum 10 is rotated around the axis.

[Second Embodiment]

A second embodiment of a method for manufacturing a catalyst for carbon nanotube synthesis according to the present invention is described below. In the method for manufacturing a catalyst for carbon nanotube synthesis according to the second embodiment, a catalyst supporting layer forming step (S2) in which catalyst supporting layers for supporting a catalyst for carbon nanotube synthesis are formed on particulate carriers (supporters) is performed before the catalyst supporting step (S1).

Figure 9:
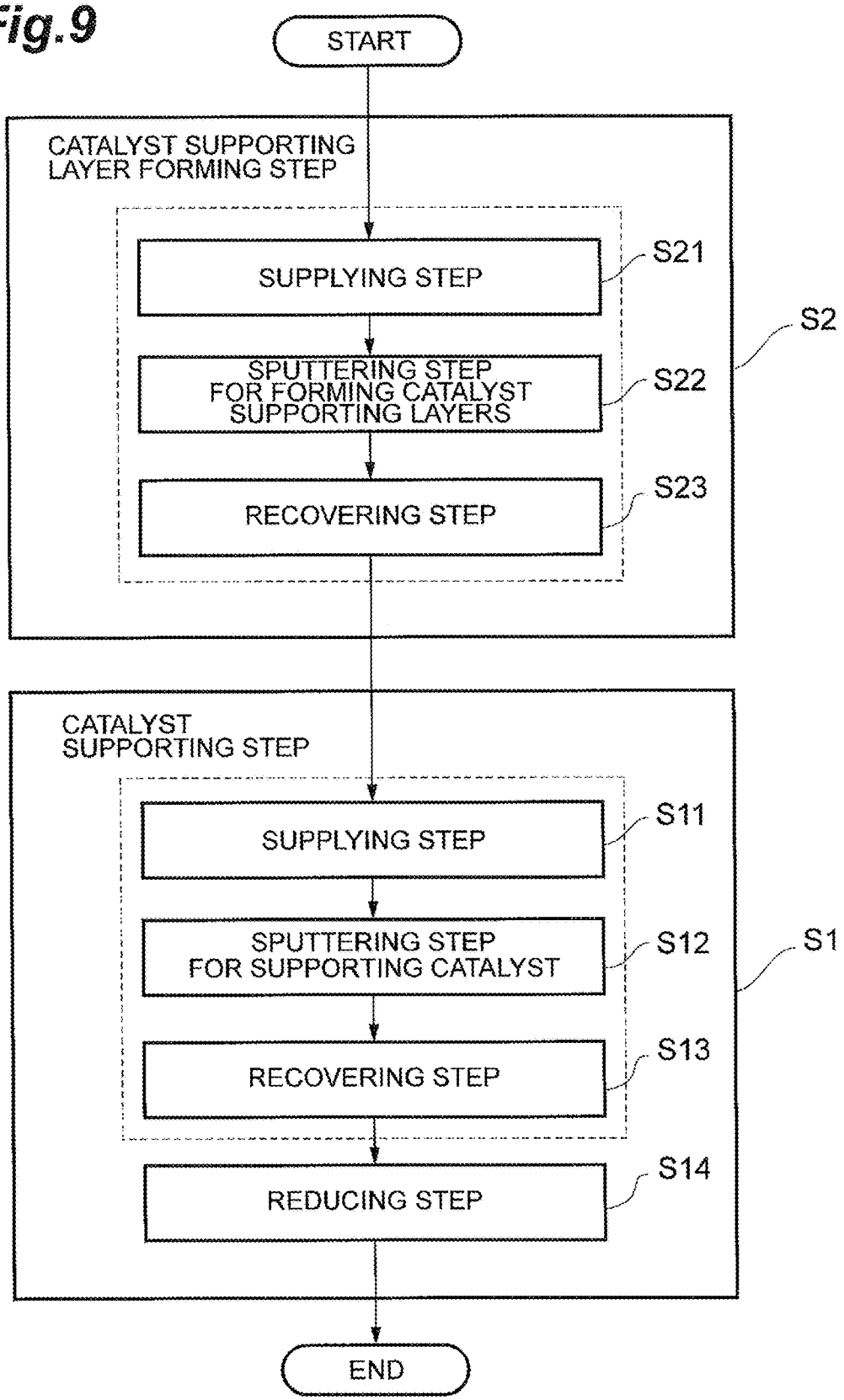
FIG. 9 is a flowchart indicating a method for manufacturing a catalyst for carbon nanotube synthesis according to a second embodiment.

FIG. 9 is a flowchart indicating a method for manufacturing a catalyst for carbon nanotube synthesis according to the second embodiment. As FIG. 9 illustrates, the method for manufacturing a catalyst for carbon nanotube synthesis according to the present embodiment includes the following steps. The catalyst supporting layer forming step (S2) is performed in which the catalyst supporting layers for supporting the catalyst for carbon nanotube synthesis are formed on the particulate carriers (supporters). Subsequently, the catalyst supporting step (S1) is performed in which the catalyst for carbon nanotube synthesis is deposited on the particulate carriers on which the catalyst supporting layers have been formed. The catalyst supporting step (S1) is identical to the catalyst supporting step (S1) in the first embodiment, and thus, its description is omitted herein.

In the catalyst supporting layer forming step (S2), the drum sputtering device 1 on which the sputtering target 16 is installed is prepared. The sputtering target 16 is formed from a material from which a catalyst supporting layers are to be formed. The drum sputtering device 1 prepared in this step has the same configuration as that described in the first embodiment.

As FIGS. 2, 3, and 9 illustrate, in the catalyst supporting layer forming step (S2), a supplying step (S21) in which the particulate carriers are supplied into the drum 10 is performed. As the particulate carriers supplied in the supplying step (S21), those on which no catalyst supporting layer or catalyst for carbon nanotube synthesis is formed are used. The supplying step (S21) is similar to the supplying step (S11) in the catalyst supporting step (S1) except for the structure of the particulate carriers to be supplied into the drum 10. The other descriptions about the supplying step (S21) are thus omitted.

Subsequently, in the catalyst supporting layer forming step (S2), a sputtering step (S22) for forming catalyst supporting layers in which the catalyst supporting layers are formed on the particulate carriers supplied into the drum 10 is performed.

In the use of Al as the catalyst supporting layers, the film thickness of the catalyst supporting layers formed on the particulate carriers is preferably 0.1 nm or larger and 1000.0 nm or smaller, further preferably 1.0 nm or larger and 500.0 nm or smaller, and still further preferably 5.0 nm or larger and 100.0 nm or smaller. When the film thickness of the catalyst supporting layers is set to 0.1 nm or larger, metal particles of the catalyst for carbon nanotube synthesis, such as iron, supported by the catalyst supporting layers can be inhibited from overgrowing in a reducing step associated with heating and a synthesizing step. In addition, the catalyst supporting layers fill the irregularities on the surfaces of the particulate carriers to be continuous layers, so that their functions can be worked out favorably. When the film thickness is set to 1.0 nm or larger and further 5.0 nm or larger, these effects are further enhanced. When the film thickness of the catalyst supporting layers is set to 1000.0 nm or smaller, the catalyst supporting layers can be inhibited from being peeled from the particulate carriers. In addition, in a reducing step associated with heating and a synthesizing step, metal particles of the catalyst for carbon nanotube synthesis, such as iron, supported by the catalyst supporting layers can be inhibited from being alloyed or solid soluble. The function as the particles of the catalyst for carbon nanotube synthesis can be thus worked out favorably. The film thickness of the catalyst supporting layers can be measured, for example, through observation of a section of a particulate carrier with a scanning electron microscope (SEM).

Sputtering the sputtering target 16 is performed while the sputtering gas supplying device 17 and the oxygen supplying device 18, respectively, supply a sputtering gas and oxygen to the vacuum container 2. The supplying of oxygen to the vacuum container 2 is not essential, but in the use of Al as the sputtering target 16 (catalyst supporting layer), oxidization of Al enhances the joint strength to the particulate carriers, therefore oxygen is preferably supplied to the vacuum container 2 in a small amount together with a sputtering gas. The ratio of oxygen to the sputtering gas is not particularly limited but can be, for example, 0.1% or higher and 20.0% or lower. In this case, the ratio of oxygen to the sputtering gas is preferably 0.5% or higher and 15.0% or lower and further preferably 1.0% or higher and 10.0% or lower. When the ratio of oxygen to the sputtering gas is 0.1% or higher, the joint strength of the catalyst supporting layers to the particulate carriers can be enhanced. Moreover, when the ratio of oxygen to the sputtering gas is 0.5% or higher and further 1.0% or higher, this effect is enhanced. When the ratio of oxygen to the sputtering gas is 20.0% or lower, the efficiency of sputtering can be maintained. When the ratio of oxygen to the sputtering gas is 15.0% or lower and further 10.0% or lower, this effect is further enhanced.

The sputtering step (S22) for forming catalyst supporting layers is similar to the sputtering step (S12) for supporting a catalyst in the catalyst supporting step (S1) except that the film thickness of the catalyst supporting layers is set as above. The other descriptions about the sputtering step (S22) for forming catalyst supporting layers are thus omitted.

Subsequently, in the catalyst supporting layer forming step (S2), a recovering step (S23) in which the particulate carriers are recovered is performed. The recovering step (S23) is the same as the recovering step (S13) in the catalyst supporting step (S1). The description about the recovering step (S23) is thus omitted.

As described above, the method for manufacturing a catalyst for carbon nanotube synthesis according to the present embodiment enables the particulate carriers to properly support the catalyst for carbon nanotube synthesis by performing the catalyst supporting layer forming step (S2) before the catalyst supporting step (S1).

Furthermore, oxygen is supplied into the vacuum container 2 to perform sputtering, whereby the catalyst supporting layers and the catalyst for carbon nanotube synthesis are oxidized to enhance the joint strength to the particulate carriers. The catalyst supporting layers and the catalyst for carbon nanotube synthesis are thus inhibited from falling off from the particulate carriers even when sputtering is performed while the drum 10 is rotated around the axis.

[Comparison]

Compared with the case using the flat sputtering device disclosed in Non Patent Literature 1, the method for manufacturing a catalyst for carbon nanotube synthesis according to the present embodiment is described below.

Figure 6:
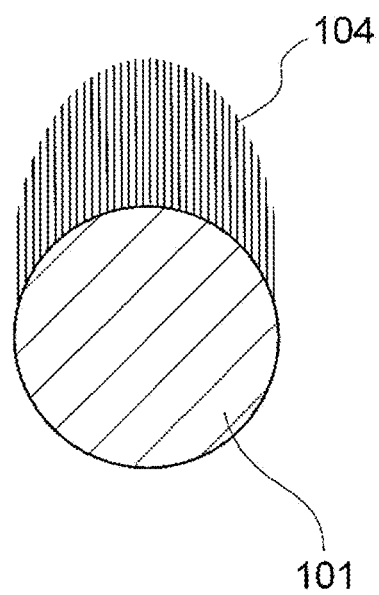
FIG. 6 is a schematic for illustrating carbon nanotubes synthesized from the catalyst for carbon nanotube synthesis manufactured with a flat sputtering device.
Figure 8:
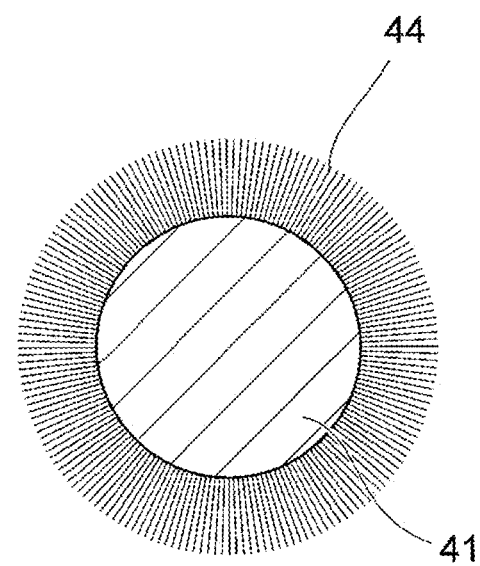
FIG. 8 is a schematic for illustrating carbon nanotubes synthesized from the catalyst for carbon nanotube synthesis manufactured by the manufacturing method in the embodiment.

FIGS. 5(a) and 5(b) are schematics for illustrating a method for manufacturing a catalyst for carbon nanotube synthesis using a flat sputtering device. FIG. 5(a) shows a catalyst supporting layer forming step, and FIG. 5(b) shows a catalyst supporting step. FIG. 6 is a cross sectional schematic for illustrating a state in which carbon nanotubes synthesized on the catalyst for carbon nanotube synthesis manufactured by the method shown in FIG. 5. FIGS. 7(a) and 7(b) are schematics for illustrating a method for manufacturing a catalyst for carbon nanotube synthesis according to the present embodiment. FIG. 7(a) shows a catalyst supporting layer forming step, and FIG. 7(b) shows a catalyst supporting step. FIG. 8 is a cross sectional schematic for illustrating a state in which carbon nanotubes are synthesized on the catalyst for carbon nanotube synthesis manufactured by the method shown in FIG. 7. FIGS. 5 and 7 illustrate the case where the catalyst supporting layers are formed from Al and the catalyst for carbon nanotube synthesis is formed from Fe.

In this flat sputtering device 100 shown in FIG. 5, particulate carriers 101 are spread all over the indentation in a flat substrate. The flat sputtering device 100 performs sputtering on the particulate carriers 101 in this state. As FIG. 5(a) illustrates, in the catalyst supporting layer forming step, catalyst supporting layers 102 are formed only on the upper surfaces of the particulate carriers 101. As illustrated in FIG. 5(b), also in the catalyst supporting step, a catalyst for carbon nanotube synthesis 103 is deposited only on the upper surfaces of the particulate carriers 101. With this configuration, even when the fine-grained catalyst for carbon nanotube synthesis is supported by the particulate carriers through reduction by heating, and a source gas for carbon nanotubes is flown thereover, carbon nanotubes 104 grow only from the upper surfaces of the particulate carriers 101 as FIG. 6 illustrates.

In contrast, in the method for manufacturing a catalyst for carbon nanotube synthesis according to the present embodiment, sputtering is performed while the drum to which the particulate carriers are supplied is rotated. The particulate carriers are thus being stirred during the sputtering. With this configuration, as FIG. 7(a) illustrates, in the catalyst supporting layer forming step, the catalyst supporting layers are formed on the entire surfaces of the particulate carriers. As FIG. 7(b) illustrates, also in the catalyst supporting step, the catalyst for carbon nanotube synthesis is deposited on the entire surfaces of the particulate carriers. With this configuration, when the fine-grained catalyst for carbon nanotube synthesis is supported by the particulate carriers through reduction by heating, and a source gas for carbon nanotubes is flown thereover, carbon nanotubes 44 radially grow from the entire surfaces of particulate carriers 41 as FIG. 8 illustrates.

The preferred embodiments of the present invention are described hereinbefore, but the present invention is not limited to the embodiments.

For example, the mechanism in which the drum is rotated around the axis and the mechanism in which the drum is swung are specifically described in the above embodiments. However, means for rotating the drum around the axis and means for swinging the drum are not particularly limited, and various known means can be employed.

In addition, the embodiments state that the drum is vertically tilted so that the connecting point between the leading end arm portion and the base end arm portion serves as the central axis. However, the central axis of the tilt of the drum is not limited to the embodiment. For example, the center of the drum in the axial direction may be the center of the tilt of the drum. In this case, the drum is swung like a seesaw about the center of the drum in the axial direction as the axis.

Although the embodiments state that the catalyst for carbon nanotube synthesis is supported by the particulate carriers on which the catalyst supporting layers have been formed, it is also possible that the particulate carriers themselves have functions as the catalyst supporting layers. In this case, the catalyst supporting layers may not be necessarily formed on the particulate carriers, so that the catalyst supporting layer forming step (S2) described above can be omitted.

The second embodiment states that the drum sputtering device 1 used in the catalyst supporting layer forming step (S2) differs from that in the catalyst supporting step (S1). In these steps, however, a single drum sputtering device 1 may also be used by replacing the sputtering target 16 arranged inside the drum 10.

EXAMPLES

Examples of the present invention will be described, but the present invention is not limited to the examples below.

Example

Al catalyst supporting layers were formed on beads as particulate carriers in the catalyst supporting layer forming step (S2). Then, in the catalyst supporting step (S1), an Fe catalyst for carbon nanotube synthesis is deposited on the catalyst supporting layers on the beads. As the beads, 200 g of φ0.5 mm alumina beads was used.

In the catalyst supporting layer forming step (S2), the drum 10 was rotated at a rotational speed of 1 rpm for 30 minutes to perform sputtering. The average film thickness of Al was 15 nm. In the catalyst supporting step (S1), the drum 10 was rotated at a rotational speed of 5 rpm for nine minutes to perform sputtering. The average film thickness of Fe was 1.0 nm.

Figure 10:
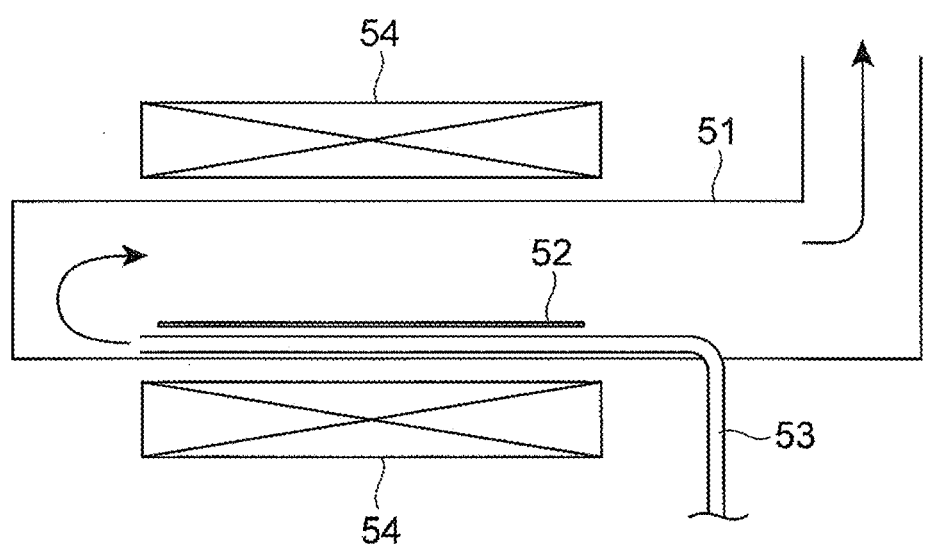
FIG. 10 is a diagram illustrating a quartz reactor.

As FIG. 10 illustrates, the beads on which sputtering with Al and Fe was performed were placed on a quartz board 52 and were arranged in a quartz reactor 51. In the reducing step of the catalyst, a state in which heat application was performed at 800° C. by a heater 54 was maintained for 10 minutes while a gas containing a reducing gas such as hydrogen supplied through a supplying pipe 53 is flown into the quartz reactor 51. Subsequently, in the carbon nanotube synthesizing step, a source gas containing acetylene supplied through the supplying pipe 53 was flown into the quartz reactor 51 to synthesize carbon nanotubes for 10 minutes.

Comparative Example

An operation was performed in a similar condition to that in the example except that sputtering was performed in a state where the drum 10 was not rotated and beads remained at rest.

(Observation)

Figure 11:
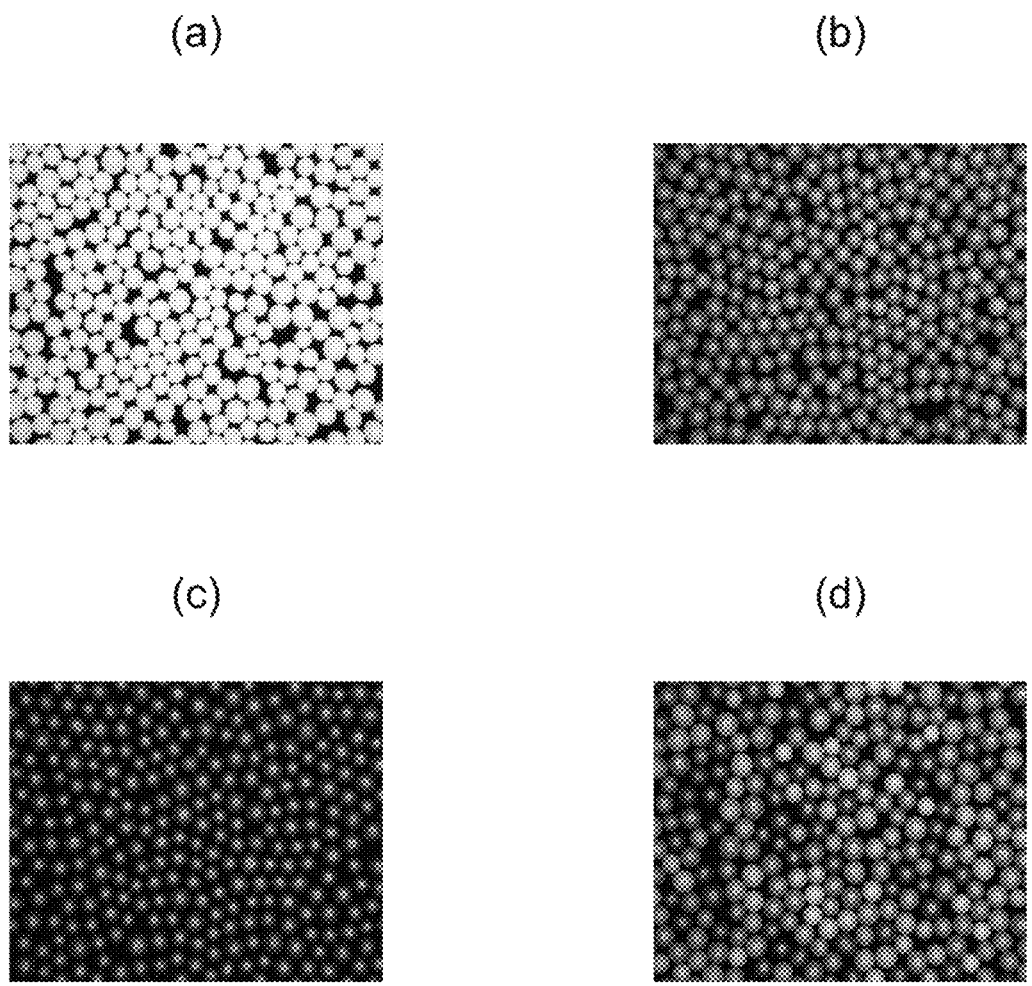
FIGS. 11(a) to 11(d) are photographs of beads.

FIGS. 11(*a*) to 11(*d*) are photographs of beads. FIG. 11(*a*) is a photograph before the catalyst supporting layer forming step (S2) in the example. FIG. 11(*b*) is a photograph after the catalyst supporting layer forming step (S2) in the example. FIG. 11(*c*) is a photograph after the catalyst supporting step (S1) in the example. FIG. 11(*d*) is a photograph after the catalyst supporting step (S1) in the comparative example. Comparison between FIGS. 11(*a*) to 11(*c*) and FIG. 11(*d*) reveals that unevenness in sputtering on the beads in the example was smaller than that in the comparative example.

Figure 12:
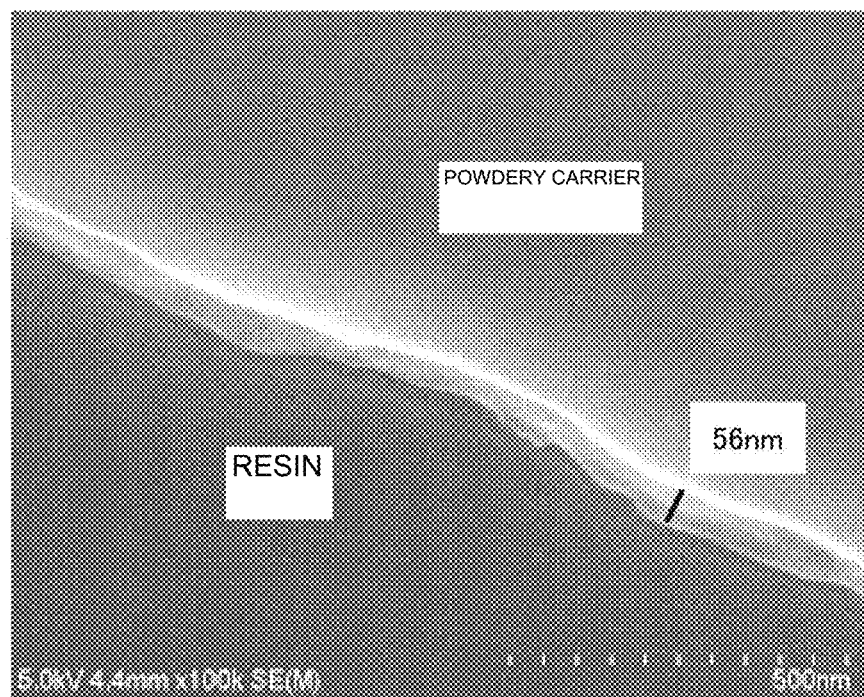
FIG. 12 is a sectional SEM image of a bead.

FIG. 12 is a sectional SEM image of a bead. The beads in the example after the catalyst supporting step (S1) were hardened with a resin. The beads were then processed through polishing to produce sections of the beads for observation. Subsequently, the sections of the beads were observed using a scanning electron microscope (SEM, manufactured by Hitachi, Ltd.: S-4800). As FIG. 12 illustrates, an Al film was formed on the entire surface of the bead in the example. The average film thickness of Al was measured from this SEM image.

FIGS. 13(*a*) and 13(*b*) are photographs of the synthesized carbon nanotubes. FIG. 13(*a*) shows carbon nanotubes synthesized on the beads in the comparative example. FIG. 13(*b*) shows carbon nanotubes synthesized on the beads in the example. As FIG. 13 illustrates, in the comparative example, the carbon nanotubes were formed only on a single side of each bead, whereas in the example, the carbon nanotubes were synthesized on the entire surfaces of the beads.

(Raman Measurement)

Figure 14:
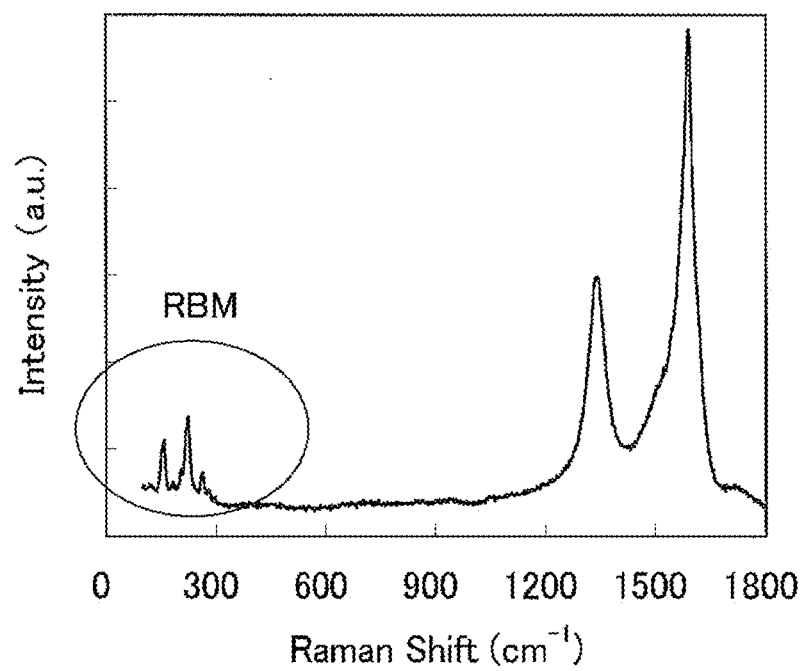
FIG. 14 is a Raman spectrum of carbon nanotubes in an example.

The crystallinity of the synthesized carbon nanotubes was evaluated by Raman spectroscopy using a Raman spectroscope (manufactured by HORIBA, Ltd.: HR-800). The measurement wavelength was 488 nm. As a result of the measurement, as FIG. 14 illustrates, the G band resulting from a graphite structure was observed near 1590 cm$^{-1}$, and the D band resulting from a crystal defect was observed near 1340 cm$^{-1}$.

At a lower wavelength side of 400 cm$^{-1}$ or lower, a plurality of peaks resulting from single walled carbon nanotubes, called radial breathing mode (RBM), were observed, which reveals that the single walled carbon nanotubes were synthesized.

REFERENCE SIGNS LIST

1 . . . drum sputtering device, 2 . . . vacuum container, 3 . . . particulate carrier supplying chamber, 4 . . . particulate carrier recovering chamber, 5 . . . upper communication opening, 6 . . . lower communication opening, 7 . . . main hatch, 8 . . . vacuum pump, 9 . . . leak valve, 10 . . . drum, 10*a* . . . both end portions in the axial direction, 10*b* . . . opening, 10*c* . . . one end face, 10*d* . . . the other end face, 10*e* . . . one end portion, 10*f* . . . the other end portion, 11 . . . supporting arm, 11*a* . . . base end arm portion, 11*b* . . . leading end arm portion, 12 . . . drive motor for rotation, 13 . . . drive motor for swing, 14 . . . first gear member, 15 . . . second gear member, 16 . . . sputtering target, 17 . . . sputtering gas supplying device, 18 . . . oxygen supplying device, 19 . . . guiding member, 21 . . . particulate carrier supplying container, 22 . . . supply door, 23 . . . supply nozzle, 24 . . . supply mechanism (first opening and closing device), 25 . . . vacuum pump, 26 . . . leak valve, 31 . . . door for the lower communication opening (second opening and closing device), 32 . . . particulate carrier recovering container, 33 . . . recovery door, 34 . . . vacuum pump, 35 . . . leak valve, 41 . . . particulate carriers, 44 . . . carbon nanotubes, 51 . . . quartz reactor, 52 . . . quartz board, 53 . . . supplying pipe, 54 . . . heater, 100 . . . flat sputtering device, 101 . . . particulate carriers, 102 . . . catalyst supporting layers, 103 . . . catalyst for carbon nanotube synthesis, 104 . . . carbon nanotubes, A . . . axis, H . . . horizontal axis, α . . . horizontal position, β . . . first inclined position, γ . . . second inclined position

The invention claimed is:

1. A method for manufacturing a catalyst for carbon nanotube synthesis, the method comprising the following steps in the following order:

a supplying step comprising supplying particulate carriers into a tubular drum, wherein the particulate carriers comprise support particles comprising at least one material selected from the group consisting of $SiO_2$, $Al_2O_3$, MgO, $SiN_4$, AlN and SiC, and wherein each support particle comprises a catalyst supporting layer comprising at least one material selected from the group consisting of $SiO_2$, $Al_2O_3$, MgO, $Si_3N_4$, AlN and SiC;

a catalyst depositing sputtering step comprising performing sputtering while the tubular drum containing the particulate carriers is rotated around an axis to deposit the catalyst for carbon nanotube synthesis on the particulate carriers, wherein the catalyst for carbon nanotube synthesis comprises at least one element selected from the group consisting of Ti, Ta, V, Cr, Fe, Co, Ni, W and Au, and wherein, in the catalyst depositing sputtering step, the tubular drum is swung so that one end portion and another end portion in an axial direction of the tubular drum are relatively vertically switched with a maximum inclination angle of the axial direction of the tubular drum with respect to a horizontal axis is between 3.0° or larger and 15.0° or smaller, and oxygen is supplied to a vacuum container that houses the tubular drum;

a recovering step comprising recovering the particulate carriers from the tubular drum by inclining the tubular drum; and a reducing step comprising reducing the catalyst for carbon nanotube synthesis on the particulate carriers by heating while a reducing gas is flown over the catalyst for carbon nanotube synthesis on the particulate carriers.

2. The method for manufacturing a catalyst for carbon nanotube synthesis according to claim 1, wherein a particulate carrier supplying chamber is connected to the vacuum container that houses the tubular drum, a first opening and closing device that opens and closes a space between the vacuum container and the particulate carrier supplying chamber is provided, and the supplying step is conducted in a state where the first opening and closing device is closed, the particulate carrier supplying chamber is brought into a vacuum state, the first opening and closing device is opened, the particulate carriers supplied to the particulate carrier supplying chamber are supplied into the tubular drum, the first opening and closing device is closed, and the particulate carrier supplying chamber is opened to atmosphere.

3. The method for manufacturing a catalyst for carbon nanotube synthesis according to claim 2, wherein a particulate carrier recovering chamber is connected below a vacuum container that houses the tubular drum, a second opening and closing device that opens and closes a space between the vacuum container and the particulate carrier recovering chamber is provided, and the recovering step recovers the particulate carriers from the particulate carrier recovering chamber in which the particulate carrier recovering chamber is brought into a vacuum state, the second opening and closing device is opened, the tubular drum is inclined to drop the particulate carriers in the tubular drum into the particulate carrier recovering chamber, the second opening and closing device is closed, and the particulate carrier recovering chamber is opened to atmosphere.

4. The method for manufacturing a catalyst for carbon nanotube synthesis according to claim 1, wherein the supplying step comprises, before the catalyst depositing sputtering step, supplying the support particles into the tubular drum, and then conducting a catalyst supporting layer depositing sputtering step comprising performing sputtering while the tubular drum containing support particles of the particulate carriers is rotated around the axis to form the catalyst supporting layer for supporting the catalyst for carbon nanotube synthesis on the support particles.

* * * * *